United States Patent
Arsovski

(10) Patent No.: US 7,724,559 B2
(45) Date of Patent: May 25, 2010

(54) SELF-REFERENCED MATCH-LINE SENSE AMPLIFIER FOR CONTENT ADDRESSABLE MEMORIES

(75) Inventor: Igor Arsovski, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 256 days.

(21) Appl. No.: 11/457,477

(22) Filed: Jul. 14, 2006

(65) Prior Publication Data

US 2008/0025073 A1 Jan. 31, 2008

(51) Int. Cl.
 *G11C 15/00* (2006.01)
(52) U.S. Cl. .............. 365/49.17; 365/49.1; 365/189.06; 365/203; 327/51
(58) Field of Classification Search ............... 365/49 O, 365/189.06 X, 203 X, 207, 49.1, 49.17, 189.06, 365/203; 327/51 X, 51
See application file for complete search history.

(56) References Cited

U.S. PATENT DOCUMENTS

| | | | |
|---|---|---|---|
| RE33,725 E | 10/1991 | Lee | |
| 5,300,839 A | 4/1994 | Kawahara et al. | |
| 5,384,736 A | 1/1995 | Jung et al. | |
| 6,181,621 B1 | 1/2001 | Lovett | |
| 6,297,670 B1* | 10/2001 | Chao et al. | 327/51 |
| 6,373,738 B1 | 4/2002 | Towler et al. | |
| 6,414,521 B1 | 7/2002 | Potter et al. | |
| 6,426,657 B1 | 7/2002 | Miyatake et al. | |
| 6,442,054 B1 | 8/2002 | Evans et al. | |
| 6,650,148 B1* | 11/2003 | Lee et al. | 327/51 |
| 6,697,277 B2 | 2/2004 | Towler et al. | |
| 6,751,110 B2 | 6/2004 | Hu | |
| 6,760,242 B1 | 7/2004 | Park et al. | |
| 6,794,901 B2* | 9/2004 | Bernstein et al. | 326/95 |
| 7,006,368 B2 | 2/2006 | Arsovski et al. | |
| 7,084,672 B1* | 8/2006 | Meng et al. | 327/51 |
| 7,095,640 B2* | 8/2006 | Ma et al. | 365/49.11 |
| 7,317,628 B1* | 1/2008 | Meng | 365/107 |
| 2006/0268592 A1 | 11/2006 | Mohammad et al. | 365/49 |

OTHER PUBLICATIONS

Igor Arsovski; "A Mismatch-Dependent Power Allocation Technique for Match-Line Sensing in Content-Addressable Memories"; IEEE Journal of Solid-State Circuits, vol. 38,No. 11, Nov. 2003, pp. 1958-1966.

Igor Arsovski et al.; "A Ternary Content-Addressable Memory (TCAM) Based on 4T Static Storage and Including a Current-Race Sensing Scheme"; IEEE Journal of Solid-State Circuits, vol. 38,No. 1, Jan. 2003, pp. 155-158.

Kostas Pagiamtzis et al.; Pipelined Match-Lines and Hierarchical Search-Lines for Low-Power Content-Addressable Memories; IEEE 2003 Custom Integrated Circuits Conference; pp. 383-386.

* cited by examiner

*Primary Examiner*—VanThu Nguyen
(74) *Attorney, Agent, or Firm*—Michael J. Le Strange; Greenblum & Bernstein P.L.C.

(57) ABSTRACT

A content addressable memory (CAM) device and process for searching a CAM. The CAM device includes a plurality of CAM cells, match-lines (MLs), search lines, and ML sense amplifiers. The ML sense amplifiers are capable of self-calibration to their respective thresholds to reduce effects of random device variation between adjacent sense amplifiers.

20 Claims, 5 Drawing Sheets

SELF-REFERENCED MATCH-LINE SENSE AMPLIFIER FOR CONTENT ADDRESSABLE MEMORIES

FIELD OF THE INVENTION

The instant invention relates to content addressable memories (CAM), and particularly to performing a search operations in a CAM.

BACKGROUND DESCRIPTION

An associative memory system called Content Addressable Memory (CAM) has been developed to permit its memory cells to be referenced by their contents. Thus CAM has found use in lookup table implementations such as cache memory subsystems and is now rapidly finding use in networking system applications such as network address translation, and other applications such as pattern recognition, and data compression. CAM's most valuable feature is its ability to perform a fast search operation in which search data is compared with data stored within the CAM. Typically search data is loaded onto search lines and compared with stored words in the CAM. During a search-and-compare operation, the CAM performs a fully parallel search and generates a match or mismatch signal associated with each stored word, indicating whether the search word matches a stored word or not.

To allow this fast parallel comparison between all stored words to a single search word, each CAM word contains dedicated search hardware. Each CAM cell contains additional bit-comparison transistors, in addition to a conventional storage element, which is typically implemented as a Static Random Access Memory (SRAM) cell or a Dynamic Random Access Memory (DRAM) cell. This added circuitry is combined across the word with a match-line (ML) to produce a match or mismatch signal for each CAM word.

Moreover, this search hardware allows the entire contents of the CAM memory to be searched in a single memory cycle.

Thus, in contrast to standard memory (SRAM or DRAM) which would typically require 1K clock cycles to complete a search of a 1K words memory, a CAM has the ability to search all entries simultaneously in a single clock cycle.

Unfortunately, as technology scales to submicron geometries, random device variation (RDV) is becoming more prominent. RDV of parameters such as transistor length, transistor width and transistor threshold voltage could be significant even in identically designed neighboring devices. The effects of RDV are especially evident in the design of semiconductor memories. Because most memories rely on sense amplifiers to detect small voltage signals on largely capacitive array lines, RDV in the memory cells as well as sense-amplifier devices can produce incorrect results. To improve reliability, memory designers tune their sensing circuits conservatively, thereby trading off performance in order to maintain a large sensing margin for reliable operation.

In advanced technologies (i.e. 100 nm and smaller gate geometry) RDV is becoming a major bottleneck for improving performance. As device variation increases, timing uncertainty for signal arrival and data capture increases, requiring larger data capture margins, and therefore limiting performance.

Due to its single-ended nature, the ML sensing performed during the CAM search operation is even more sensitive to RDV than the differential sensing used in the SRAM read circuitry. Thus, to maintain reliable operation, most ML sensing schemes employ full-swing sensing which is both slow and power-inefficient.

SUMMARY OF THE INVENTION

An aspect of the invention is a CAM device that includes a plurality of CAM cells, match-lines, search lines, and match-line sense amplifiers. The match-line sense amplifiers are capable of self-calibration to their respective thresholds to reduce effects of random device variation between adjacent sense amplifiers.

Another aspect of the invention is a process for searching a CAM device having match-lines and sense amplifiers. The process includes precharging the match-lines to thresholds of their respective sense amplifiers.

Another aspect of the invention is a CAM device that includes elements coupled to ends of match-lines, in which each element has a respective threshold voltage value. Further, the CAM device includes a device for charging the match-lines to the respective threshold voltage values.

DETAILED DESCRIPTION OF THE EMBODIMENTS OF THE INVENTION

The present invention is directed to a self-referenced matched line sense amplifier, such that the ML sense amplifier benefits from conventional low power ML sensing schemes with significantly reduced susceptibility to RDV. Thus, the invention is directed to a novel RDV-insensitive self-referenced ML sense amplifier, which provides reliable operation and achieves sub-nanosecond match-times while dissipating less power than a number of currently used methods.

The sense amplifier performs a self-calibration to reduce the timing uncertainty caused by device variation in both the sensed circuitry and the sense amplifier itself. After this calibration, the sense amplifier simply determines whether a Match-Line is matched or mismatched to complete the search.

Figure 1:
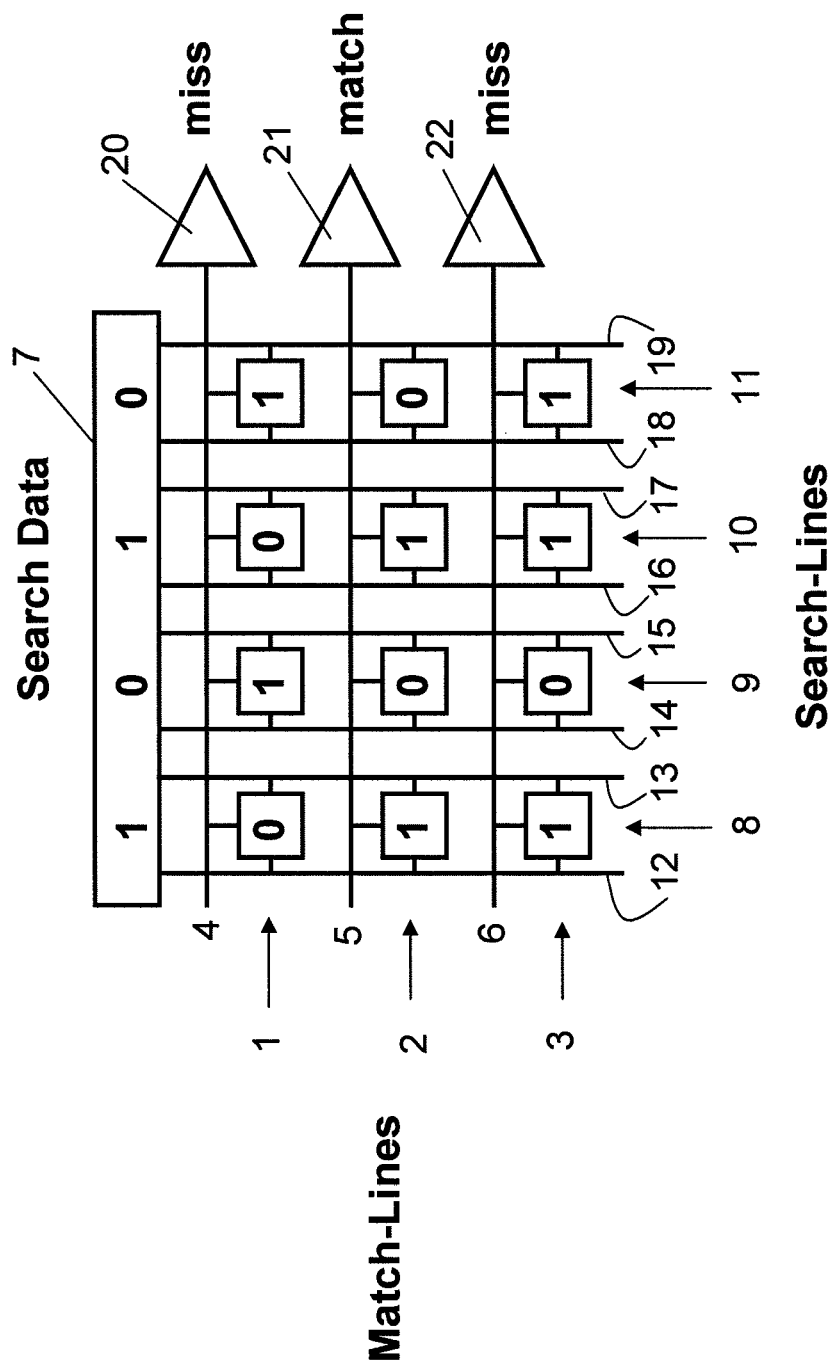
FIG. 1 illustrates a general architecture for a conventional CAM arrangement.

In a conventional CAM sensing scheme, as shown in FIG. 1, CAM core cells are arranged in horizontal rows, 1, 2, and 3, composed of, e.g., four cells, and each CAM core cell of a respective horizontal row is coupled to MLs 4, 5, and 6. As the number of cells in a row corresponds to the length of the word to be searched, any number of cells can be utilized by those ordinarily skilled in the art without departing from the spirit of the invention. Further, for the sake of easy explanation, only three MLs 4-6 are shown. Again, any number of MLs can be utilized by the ordinarily skilled artisan. Moreover, the CAM core cells are arranged in columns 8, 9, 10, and 11. While only four columns are shown, the number of columns corresponds to the number of bits in the CAM core cell word to be searched, such that any number of columns can be utilized.

Search data 7, i.e., the data word to be searched, is provided for comparison with each word formed in CAM rows 1-3. Parallel search lines 12-19 are coupled to search data 4, and each CAM core cell in a respective column is coupled to two search lines so that each cell corresponding to a data bit of the search data 7 can be searched for a match. Thus, search data 7 is applied to search lines 12-19 in parallel. Search results develop on MLs 4-6 in parallel and are applied to respective search amplifiers 20-22.

Figure 2:
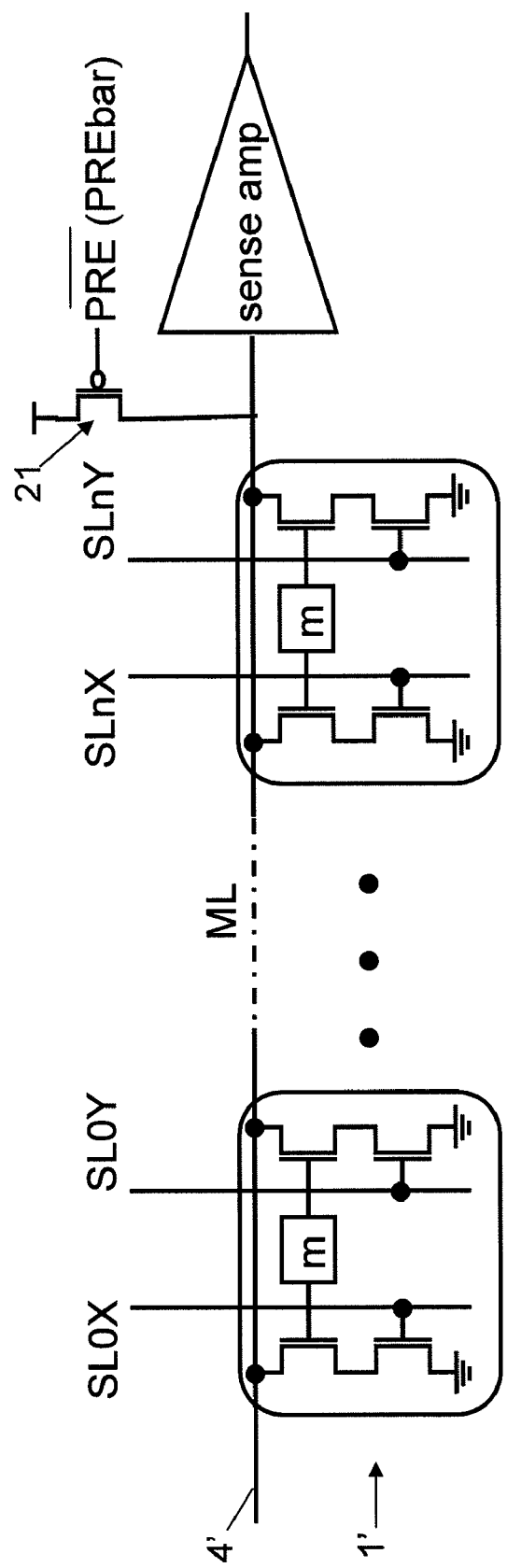
FIG. 2 illustrates a conventional CAM entry illustrating a ML architecture that can be used to sense a ML that is initially pre-charged high.

Conventional CAM searches have been performed with the MLs precharged high. As shown in FIG. 2, a conventional row 1' of CAM core cells to be searched is shown, and each cell of row 1' is coupled to a ML 4'. Moreover, each CAM core cell, which can be in binary or ternary form, includes a storage element m, e.g., an SRAM or DRAM, and a pair of stacks of nFETs coupled between ML 4' and ground. The upper nFETs of each stack is coupled to storage element m, while the lower nFETs are coupled to the pair of search lines associated with the cell column. For a search operation, search lines are initially set to ground, and the MLs are precharged high to Vdd, when a precharge bar signal (PREbar) is low to turn on pFET 21. To perform the comparison between the search to stored data the signal PREbar is raised high to stop the precharge and the search data is applied on the search lines, causing the results to develop on the MLs. If any bit in the storage elements does not match the respective searched bits of the search data, the precharged ML is pulled to ground through the mismatched nFET stacks, whereas, if all bits match the searched data, the precharged ML stays high. The signals on the MLs are applied to respective sense amplifiers, which differentiates whether the respective ML is at Vdd or ground.

Figure 3A:
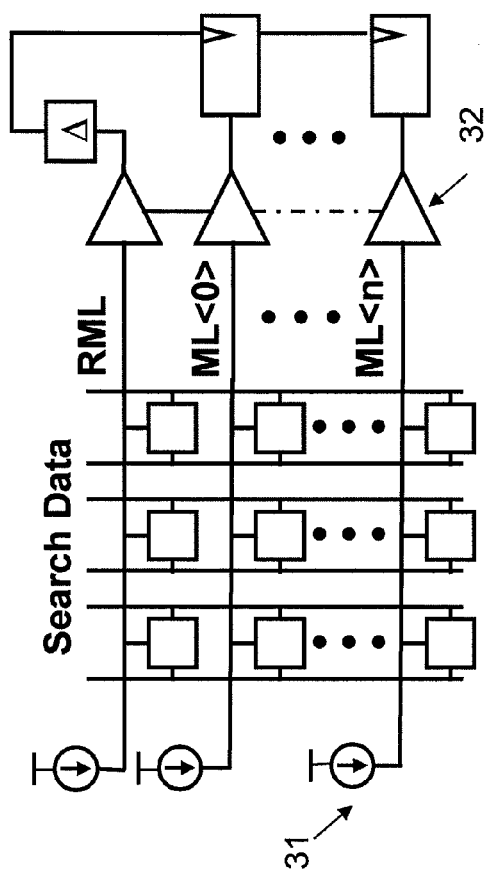
FIGS. 3a and 3b illustrate an alternative CAM array architecture and ML arrangement which can be used to sense a ML which is initially precharged low.
Figure 3B:
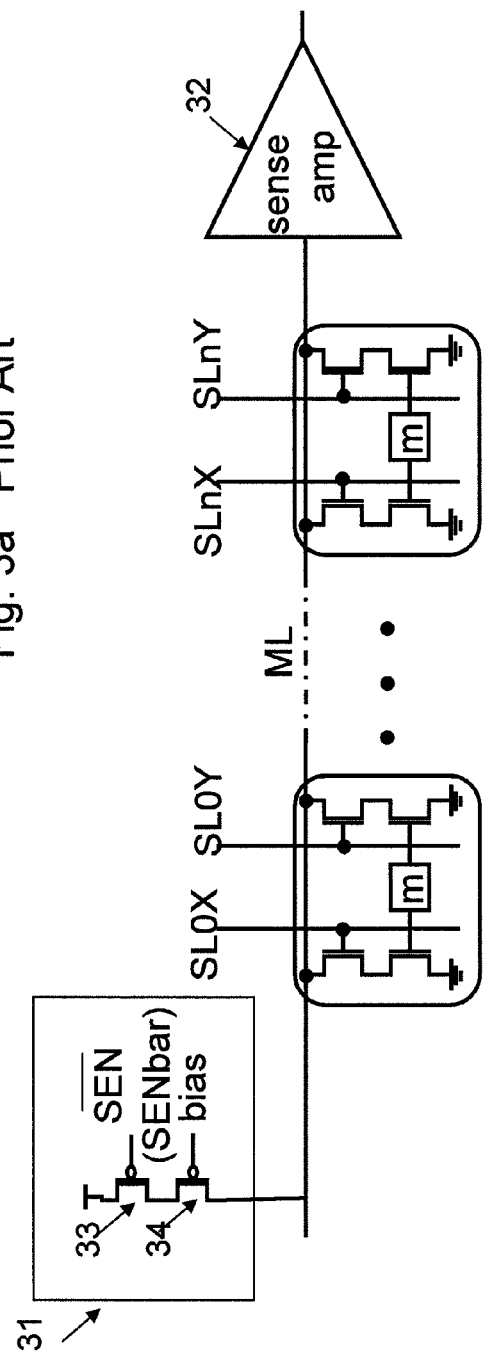

In an alternative conventional CAM search arrangement shown in FIGS. 3a and 3b, the MLs are initially precharged low. The arrangement depicted in FIG. 3a additionally includes an additional row provided as a reference ML RML, which develops at a same time as a full match. As shown in the figure, the sensing amplifier associated with RML is coupled to a latch to establish a search time corresponding to the time to reach the threshold voltage of the sensing amplifier. For a search, the MLs are initially set to ground, instead of Vdd as in FIG. 2, and equal currents are applied to them through a current source shown as 31. For ease of explanation and illustration, FIG. 3b shows a single ML in which current source 31 can be formed by a stack of pFET devices 33 and 34. As illustrated, pFET 33 turns current source 31 "on" and "off" with the SENbar signal, while pFET 34 acts as a current limiting device to ensure correct differentiation between a match and a mismatch. As the voltage on the MLs increases, matches ramp up faster than mismatches, and the current race stops when RML voltage reaches the threshold voltage of its sense amplifier. At this point, the RML search amplifier generates the LATCH signal to capture all search results and complete the search operation, in which the voltage on all matched MLs would have crossed the threshold of their respective sense amplifiers, while the voltage on the mismatched MLs would have stayed below the threshold of their respective sense-amplifiers. Since the voltage swing on all MLs is reduced from Vdd to about ½ Vdd, and the precharge to ground statistically reduces search line switching activity by 50%, this search scheme significantly reduces power. Moreover, in contrast to the ML configuration depicted in FIG. 2, in the precharge-low ML sensing scheme of FIG. 3b the nFET stacks within the CAM cells are reversed. In particular, the upper nFETs in the CAM cells are coupled to the pair of search lines associated with the cell column, while the lower nFETs are coupled to storage element m.

The sense amplifiers for the above-noted conventional arrangements are very sensitive to variations in PMOS/NMOS skews and RDV which cause large sensing-circuit trip-point variation, which in turn demands large delay for reliable data capture timing and increased sense times. Therefore, in contrast to the noted conventional arrangements, the present invention employs self-referenced ML sense amplifiers to quickly precharge the MLs to the threshold of their respective sense amplifiers, to release-the-precharge, to develop-ML-signal, and finally to sense the developed signal. By precharging each ML to the threshold voltage of its unique sense-amplifier, the invention significantly reduces the timing uncertainty caused by the above-noted skews and large RDV. Moreover, because threshold voltages can vary largely even for neighboring sense-amplifiers, each sense amplifier can be advantageously self-referencing.

Figure 4:
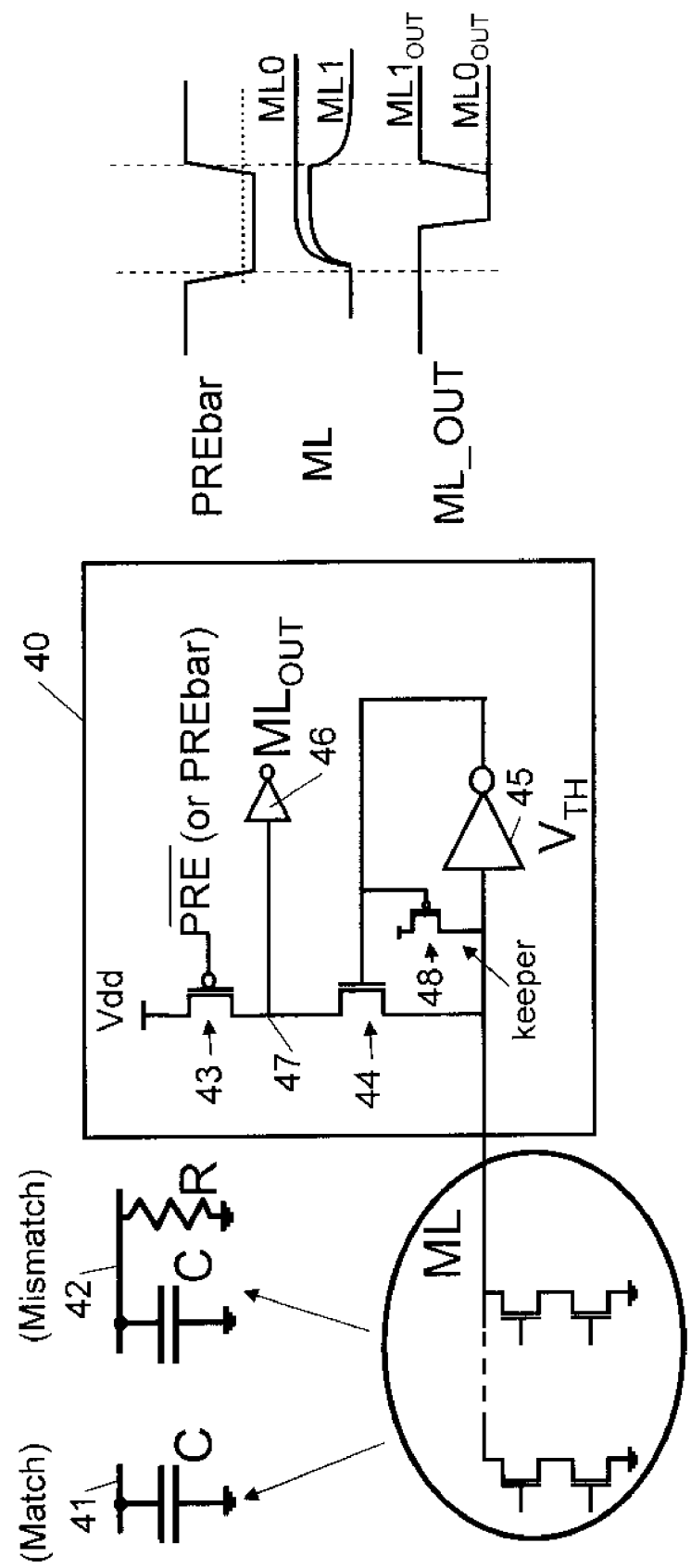
FIG. 4 illustrates a self-referenced sense amplifier in accordance with the invention.

As shown in FIG. 4, a self-referenced sense amplifier 40 is coupled to the ML of a CAM to determine the state of the ML. The self-referenced sense amplifier 40 includes a pFET transistor 43 coupled in series to an nFET transistor 44 to connect ML to a voltage source at Vdd. An inverter 45 is coupled to the end of ML, and the output of inverter 45 is fed back to the gate of nFET 44, while the gate of pFET 43 is coupled to PREbar. Moreover, an inverter 46 is coupled to a sense node 47 between pFET 43 and nFET 44 to output the ML determination.

Prior to operation, ML is set low, e.g., to ground, and precharge bar PREbar is set high, e.g., to Vdd. In operation, ML is precharged to the threshold (or trigger point) of the inverter 45, and, thereafter, ML sensing occurs. To begin precharging ML from its initial low, PREbar goes low from its initial high, which turns on pFET 43. Because ML is initially set low, the gate of nFET 44 is set high by inverter 45, turning on nFET 44, whereby current flows to begin quickly charging ML to the threshold of inverter 45. When the voltage on ML crosses the threshold of inverter 45, inverter 45 will start discharging the gate of nFET 44 low until nFET 44 turns off. As a result, sense node 47, which was originally coupled to ML through nFET 44, uses the full charge provided by pFET 43 to charge node 47 to Vdd and, cause the output of inverter 46 is discharged low to GND. Precharge bar PREbar is subsequently disabled by a signal from a one-bit miss reference ML (not shown). Moreover, an optional keeper 48 can be coupled between the gate of nFET 44 and ML. Keeper 48 is provided to maintain the precharged value to prevent leakage on ML from being misinterpreted as a mismatch.

According to the invention, a reference ML (RML), such as depicted in FIG. 3a, can be utilized with the embodiment depicted in FIG. 4. Moreover, as shown in the timing diagrams, when PREbar is low, e.g., for 750 psec., the MLs ML0 (match) and ML1 (one-bit miss) begin charging. Because ML1, which corresponds to reference ML (RML) depicted in FIG. 3a, charges up slower than match ML0, it ensures that the PREbar will be low for a sufficient time to precharge all matched MLs to the unique threshold of their respective sense-amplifiers. The one-bit miss reference ML will then stop or disable PREbar and allow all MLs to develop a match or mismatch signal. By precharging all MLs to the threshold of their respective sense-amplifiers, each one-bit mismatched ML will trigger its respective sense amplifier at essentially the same time as the reference ML, thereby reducing the timing uncertainty caused by RDV and improving sense-performance. The one-bit miss reference ML1 is used to generate both the precharge timing and the data capture timing to ensure sufficient time for even the worst case match charge up, as well as fast latch time that ensures reliable data capture.

When matched, ML acts like a simple capacitor (schematically shown as 41) such that both the ML as well as the sense node 47 remain precharged, and the output of inverter 46 remains low. Alternatively, when a mismatch occurs, ML acts like a capacitor in parallel with a resistor (schematically shown as 42), where the resistor models a turned-on pull-down device, to pull down ML. As a result of this pull down, ML will fall below the threshold voltage of inverter 45, such that the output of inverter 45 will flip to a high state and turn on nFET 44. Turning on nFET 44 discharges sense node 47 from its precharged Vdd-level back to the to ML voltage level, causing the output of inverter 46 to go high (see ML1 and ML1OUT timing diagram). To minimize the timing uncertainty inverter 46 is designed to have a higher trip point than inverter 45.

Thus, matches precharge above their sense threshold and remain precharged, while one-bit misses precharge above their sense threshold and then discharge. Since all but largely mismatched MLs are precharged to the thresholds of their respective sense amplifiers, the sensing is fast and all sense-amplifiers trigger at a same time reducing the timing uncertainty caused by RDV. Correspondingly, the sense nodes for matches drops to low and remains there until it is reset, whereas the sense nodes for one-bit misses and mismatches drop to low and then back to high (see timing diagram ML_OUT). Due to the self-reference nature of the sense amplifiers, even though the MLs exhibit different switching times during precharging, the sense-amplifiers trigger at the same time during sensing.

Because inverters have random variation of, e.g., 300-500 mV, at their trigger points and because all MLs are not the same due to, e.g., RDV, the self-referenced sense amplifier of the present invention reduces timing uncertainty by allowing each sense-amplifier to precharge its match line MLs to a unique voltage level relative to its threshold. By doing so, the invention improves timing uncertainty and with it sensing speed.

Figure 5:
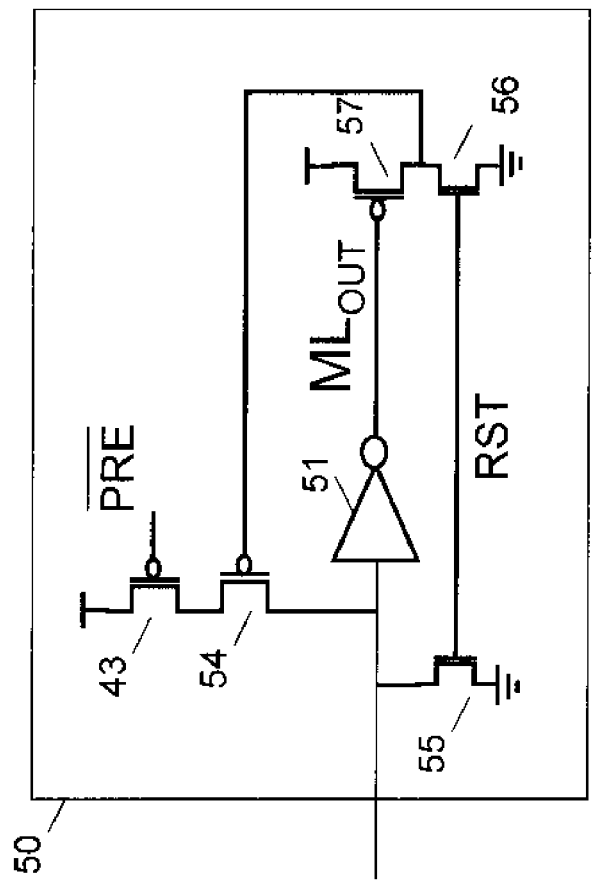
FIG. 5 illustrates an alternative arrangement of the self-referenced sense amplifier depicted in FIG. 4.

In an alternative embodiment of the invention as shown in FIG. 5, self-referenced sense amplifier 50 is created using only pFET transistors in its ML precharge path. This alternative embodiment includes a pFET transistor 43 coupled in series to a pFET transistor 54 to connect ML to a voltage source at Vdd. An inverter 51 is coupled to the end of ML, and the output of inverter 51' is fed to the gate of pFET 57. The source of pFET 57 is connected to Vdd, while its drain is connected back to the gate of pFET 54 and to the drain of nFET 56. The gate of nFET 56 is connected to a signal RST, which is also attached to the gate of nFET 55. The drain of nFET 55 is attached to the ML and its source is attached to Gnd. Precharge pFET 43 is coupled to PREbar.

Prior to searching in this embodiment, the ML and the gate of pFET 54 are discharged low by pulsing RST high. PREbar is then pulsed low for a period of time to allow adequate precharging of the MLs. As the MLs pass the threshold of their respective inverters, and in the illustrated embodiment, as the ML passes the threshold of inverter 51, pFET 57 is turned 'on' to begin charging the gate of pFET 54 to Vdd. This causes pFET 54 to turn off and stop the precharging of the MLs. At this point, matches will remain at the precharged voltage, while mismatches will discharge to Gnd, thereby switching $ML_{OUT}$ back high. As a result of this configuration, ML can be charged to slightly higher than the threshold of a single inverter (sense amplifier), thereby improving noise immunity.

Figure 6:
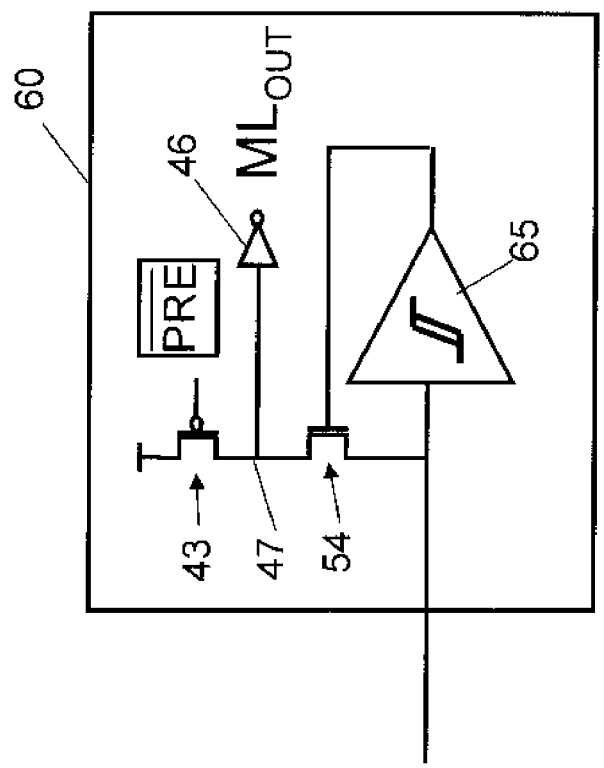
FIG. 6 illustrates an alternative arrangement of the self-referenced sense amplifier depicted in FIG. 5.

A self-referenced sense amplifier 60 shown in FIG. 6 depicts a further embodiment of the invention. Like the alternative embodiment depicted in FIG. 5, self-referenced sense amplifier 60 includes a pFET transistor 43 coupled in series to an nFET transistor 54 to connect ML to a voltage source at Vdd. A Schmitt-trigger 65 is coupled to the end of ML, and the output of Schmitt-trigger 65 is fed back to the gate of nFET 54, while the gate of pFET 43 is coupled to PREbar. Moreover, an inverter 46 is coupled to a sense node 47 between pFET 43 and nFET 54 to output the ML determination. As a result of this Schmitt-trigger controlled arrangement, the ML sense amplifier can have a precharge point of the ML higher than the sense node, allowing additional noise margin during sense time.

Accordingly, the self-referenced sense amplifier of the present invention improves tolerance to RDV. Even with a large process variation in critical devices in both across wafer and across chip, the self-referenced sense amplifier provides fast and reliable sensing.

As the invention senses a pull-down on a highly capacitive line, it is contemplated that, without departing from the scope and spirit of the invention, the invention can be used in Read-Only Memories (ROM) multi-port SRAM or single port SRAMs which use an eight-transistor cell as their storage unit) or other RAMs where the pull-down structure is similar to the CAM ML. In general, the invention can be used to sense small resistance on a highly capacitive line in processes with large RDV.

While the invention has been described in terms of a preferred embodiment, those skilled in the art will recognize that the invention can be practiced with modifications within the spirit and scope of the appended claims.

What is claimed:

1. A content addressable memory (CAM) device comprising:
   a plurality of CAM cells;
   match-lines;
   search lines;
   match-line sense amplifiers; and
   keepers coupled across the match-line sense amplifiers to maintain a precharged value,
   wherein the match-line sense amplifiers are capable of self-calibration to their respective thresholds to reduce effects of random device variation between any two sense amplifiers.

2. The CAM device in accordance with claim 1, further comprising switch units coupled to the match-lines to precharge each match-line to threshold of its associated match-line sense amplifiers.

3. The CAM device in accordance with claim 2, wherein the switching units comprise at least two FETs arranged in series between a supply voltage and the match-lines.

4. A content addressable memory (CAM) device comprising:
   a plurality of CAM cells;
   match-lines;
   search lines;
   match-line sense amplifiers, wherein the match-line sense amplifiers are capable of self-calibration to their respective thresholds to reduce effects of random device variation between adjacent sense amplifiers;
   keepers coupled across the match-line sense amplifiers that are structured and arranged to prevent leakage on the match-lines from being misinterpreted as a mismatch;

switch units coupled to the match-lines to precharge each match-line to threshold of its associated match-line sense amplifiers, wherein the switching units comprise at least two FETs arranged in series between a supply voltage and the match-lines; and inverters coupled to sense nodes located between the at least two FETs of the switching units, wherein outputs of the inverters are indicative of one of a match or a mismatch.

5. The CAM device in accordance with claim 4, wherein the FETs located between the sense nodes and the match-lines are turned off and on by elements coupled to an end of the match-line.

6. The CAM device in accordance with claim 2, wherein the thresholds correspond to thresholds of an element coupled to an end of the match-line.

7. The CAM device in accordance with claim 6, wherein the element comprises at least one inverter.

8. The CAM device in accordance with claim 6, wherein the element comprise a Schmitt trigger.

9. A process for searching a content addressable memory (CAM) device having match-lines and sense amplifiers, the process comprising:

precharging the match-lines to thresholds of their respective sense amplifiers; and maintaining a precharged value in order to prevent leakage from the match-lines being misinterpreted as a mismatch.

10. A process for searching a content addressable memory (CAM) device having match-lines and sense amplifiers, the process comprising:

precharging the match-lines to thresholds of their respective sense amplifiers, and when the match-lines are precharged to thresholds, the process further comprises:

interrupting precharging of match-lines;

charging sense nodes; and maintaining the precharged threshold with a keeper coupled across the respective sense amplifier.

11. A process for searching a content addressable memory (CAM) device having match-lines and sense amplifiers, the process comprising:

precharging the match-lines to thresholds of their respective sense amplifiers, and when the match-lines are precharged to thresholds, the process further comprises:

interrupting precharging of match-lines;

charging sense nodes; and maintaining the precharged threshold with a keeper coupled across the respective sense amplifier, wherein, in the event of mismatches, the sense nodes are shorted to the match-lines.

12. A process for searching a content addressable memory (CAM) device having match-lines and sense amplifiers, the process comprising:

precharging the match-lines to thresholds of their respective sense amplifiers, and when the match-lines are precharged to thresholds, the process further comprises:

interrupting precharging of match-lines; and charging sense nodes; and preventing leakage on the match-lines from being misinterpreted as a mismatch with a keeper coupled across the respective sense amplifier, wherein, in the event of matches, the sense nodes are isolated from the match-lines.

13. A process for searching a content addressable memory (CAM) device having match-lines and sense amplifiers, the process comprising:

precharging the match-lines to thresholds of their respective sense amplifiers; and keepers coupled across the respective sense amplifiers to maintain the precharged threshold, wherein a precharging signal is enabled until a threshold of a sense amplifier associated with a one-bit reference is attained.

14. The process in accordance with claim 9, wherein the thresholds of the respective sense amplifiers correspond to thresholds of at least one element coupled to the end of the match-lines.

15. The process in accordance with claim 14, wherein the element comprises at least one inverter.

16. The process in accordance with claim 13, wherein the element comprises a Schmitt trigger.

17. A content addressable memory (CAM) device comprising:

elements coupled to ends of match-lines, wherein each element has a respective threshold value; and a device for charging the match-lines to the respective threshold values; and keepers structured and arranged to prevent leakage from the match-lines being misinterpreted as a mismatch.

18. The CAM device in accordance with claim 17, further comprising switch units coupled to the match-lines to precharge the match-lines to thresholds of the match-line sense amplifiers.

19. The CAM device in accordance with claim 18, wherein the switching units comprise at least two FETs arranged in series between a supply voltage and the match-lines.

20. A content addressable memory (CAM) device comprising:

elements coupled to ends of match-lines, wherein each element has a respective threshold value;

a device for charging the match-lines to the respective threshold values;

switch units coupled to the match-lines to precharge the match-lines to thresholds of the match-line sense amplifiers; and keepers coupled across the match-line sense amplifiers to maintain a precharged value, wherein the switching units comprise two FETs, and the device further comprises inverters coupled to sense nodes located between the two FETs, wherein outputs of the inverters are indicative of one of a match or a mismatch.

* * * * *